(12) United States Patent
Raman et al.

(10) Patent No.: US 10,345,394 B2
(45) Date of Patent: Jul. 9, 2019

(54) HALL SENSOR READOUT SYSTEM WITH OFFSET DETERMINATION USING THE HALL ELEMENT ITSELF

(71) Applicant: MELEXIS TECHNOLOGIES NV, Tessenderlo (BE)

(72) Inventors: Johan Raman, Knesselare (BE); Pieter Rombouts, Mariakerke (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 257 days.

(21) Appl. No.: 15/034,738

(22) PCT Filed: Nov. 6, 2014

(86) PCT No.: PCT/EP2014/073856
§ 371 (c)(1),
(2) Date: May 5, 2016

(87) PCT Pub. No.: WO2015/067675
PCT Pub. Date: May 14, 2015

(65) Prior Publication Data
US 2016/0252589 A1 Sep. 1, 2016

(30) Foreign Application Priority Data

Nov. 6, 2013 (GB) .................................. 1319627.4

(51) Int. Cl.
*G01R 33/00* (2006.01)
*G01R 33/07* (2006.01)

(52) U.S. Cl.
CPC ..... *G01R 33/0035* (2013.01); *G01R 33/0029* (2013.01); *G01R 33/0082* (2013.01); *G01R 33/07* (2013.01)

(58) Field of Classification Search
CPC ............ G01R 33/0029; G01R 33/0035; G01R 33/0082; G01R 33/07; G01R 33/0017; G01R 33/007; G01R 33/075
(Continued)

(56) References Cited

U.S. PATENT DOCUMENTS

| 4,327,416 A | 4/1982 | Jerrim |
| 4,833,406 A | 5/1989 | Foster |

(Continued)

FOREIGN PATENT DOCUMENTS

| DE | 4302342 A1 | 7/1993 |
| DE | 10154495 A1 | 5/2003 |

(Continued)

OTHER PUBLICATIONS

Great Britain Search Report for corresponding Great Britain Application No. 1319627.4, dated Jul. 4, 2014.

(Continued)

*Primary Examiner* — Jeff W Natalini
*Assistant Examiner* — Steven L Yeninas
(74) *Attorney, Agent, or Firm* — Workman Nydegger (57) ABSTRACT

A method for providing offset compensation in a Hall sensor comprising at least one Hall element having a plate-shaped sensor element made of a doped semiconductor material, comprises using measurements on the Hall element itself. The method comprises obtaining a first readout signal ($V_H$) from the at least one Hall element which is substantially dependent on the magnetic field, obtaining a second readout signal ($V_P$) from the at least one Hall element which is substantially independent of the magnetic field, and using the second readout signal ($V_P$) for obtaining a prediction ($\hat{V}_O$) of the offset ($V_O$) on the first readout signal ($V_H$).

17 Claims, 4 Drawing Sheets

(58) Field of Classification Search
USPC .................. 324/202, 224, 225, 251, 207.12;
327/513, 511; 702/99, 104
See application file for complete search history.

(56) References Cited

U.S. PATENT DOCUMENTS

| | | | |
|---|---|---|---|
| 5,406,202 | A | 4/1995 | Mehrgardt et al. |
| 6,304,074 | B1 | 10/2001 | Waffenschmidt |
| 6,362,618 | B1 * | 3/2002 | Motz .................... G01R 33/07 |
| | | | 324/225 |
| 6,768,301 | B1 | 7/2004 | Hohe et al. |
| 6,906,514 | B2 | 6/2005 | Ausserlechner |
| 7,437,260 | B2 | 10/2008 | Ausserlechner et al. |
| 7,440,861 | B2 | 10/2008 | Ausserlechner et al. |
| 7,980,138 | B2 | 7/2011 | Ausserlechner |
| 8,311,760 | B2 * | 11/2012 | Hohe .................... G01D 3/0365 |
| | | | 324/207.12 |
| 9,551,765 | B2 | 1/2017 | Röhrer et al. |
| 9,671,486 | B2 * | 6/2017 | Ausserlechner ..... G01R 35/005 |
| 2001/0020845 | A1 | 9/2001 | Muth |
| 2005/0001487 | A1 | 1/2005 | Ausserlechner |
| 2005/0162160 | A1 | 7/2005 | Ausserlechner et al. |
| 2007/0018655 | A1 * | 1/2007 | Ausserlechner ........ H01L 23/34 |
| | | | 324/501 |
| 2008/0111565 | A1 | 5/2008 | Ausserlechner et al. |
| 2008/0238410 | A1 * | 10/2008 | Charlier ............. G01R 33/0017 |
| | | | 324/202 |
| 2009/0108839 | A1 | 4/2009 | Ausserlechner |
| 2012/0262163 | A1 | 10/2012 | Han et al. |
| 2013/0200909 | A1 | 8/2013 | Rasbornig et al. |
| 2014/0163911 | A1 * | 6/2014 | Rohrer ............... G01R 33/0029 |
| | | | 702/64 |
| 2014/0184211 | A1 * | 7/2014 | Fujita ................. G01R 33/0052 |
| | | | 324/225 |
| 2014/0210461 | A1 * | 7/2014 | Ausserlechner ..... G01R 33/075 |
| | | | 324/251 |
| 2015/0115937 | A1 * | 4/2015 | Fujita .................... G01R 33/07 |
| | | | 324/207.12 |

FOREIGN PATENT DOCUMENTS

| | | |
|---|---|---|
| DE | 10154498 A1 | 5/2003 |
| DE | 102004003853 A1 | 8/2005 |
| DE | 102008051949 A1 | 5/2009 |
| DE | 102011102483 A1 | 11/2012 |
| EP | 0548391 A1 | 6/1993 |
| EP | 1503181 A1 | 2/2005 |
| EP | 2360455 A1 | 8/2011 |
| JP | 2008096213 A | 4/2008 |
| KR | 20120116036 A2 | 10/2012 |
| WO | 0118556 A1 | 3/2001 |
| WO | 2012160143 A2 | 11/2012 |
| WO | 2013167631 A1 | 11/2013 |

OTHER PUBLICATIONS

International Preliminary Report on Patentability for corresponding International PCT Application No. PCT/EP2014/073856, dated Dec. 9, 2015.
International Search Report for corresponding International PCT Application No. PCT/EP2014/073856, dated Mar. 2, 2015.
Shibata et al., "A Potential Problem for Point Contacts on a Two-Dimensional Anisotropic Medium with an Arbitrary Resistivity Tensor," J. Appl. Phys., Nov. 15, 1989, pp. 4603-4607, vol. 66, No. 10.
Udo, "Limits of Offset Cancellation by the Principle of Spinning Current Hall Probe", Proceedings of IEEE Sensors, Oct. 2004, pp. 1117-1120.
Van Der Pauw, "A Method of Measuring Specific Resistivity and Hall Effect of Discs of Arbitrary Shape," Philips Research Reports, Feb. 1958, pp. 1-9, vol. 13, No. 1.
Korean Office Action from KR Application No. 10-2016-7014458, dated Jul. 20, 2018.
Japanese Office Action from JP Application No. 2016-527287, dated Jun. 26, 2018.

* cited by examiner

HALL SENSOR READOUT SYSTEM WITH OFFSET DETERMINATION USING THE HALL ELEMENT ITSELF

FIELD OF THE INVENTION

The present invention relates to methods and devices for offset determination in Hall sensor readout, the offset being for instance due to temperature, temperature gradients, (package-induced) mechanical stress, inhomogeneities in doping concentrations and geometrical errors. In particular, the present invention relates to methods and devices for offset compensation in sensors comprising a Hall plate, by using measurements on the Hall plate itself.

BACKGROUND OF THE INVENTION

Figure 1:
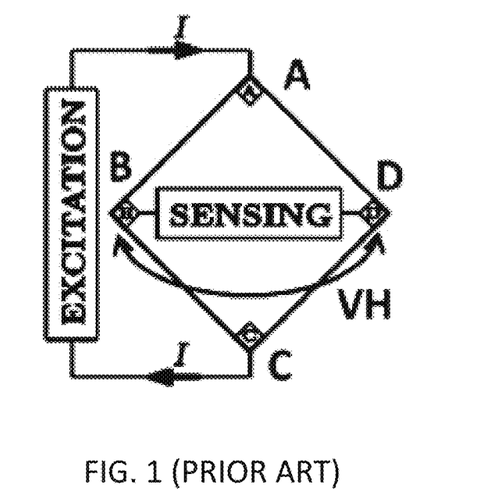
FIG. 1 shows a known way of measuring a Hall-voltage representative for the strength of a magnetic field component, where an excitation source is applied to two contacts, and an output is sensed over two other contacts.

Hall elements are magnetic field sensors which are based on the Hall effect and provide an electrical output signal which is proportional to a predetermined component of the magnetic field. A basic Hall device consist of a conducting material provided with at least four electrical contacts. In order to make use of the Hall effect, a current has to flow through the device. A bias current I is supplied via two of the contacts, which will be referred to as the current contacts. Two other contacts, referred to as the sense contacts, are typically placed on an equipotential line, to make the voltage difference between the sense contacts zero in the absence of a magnetic field. The principle of measuring a magnetic field component Bz using a horizontal Hall element is illustrated in FIG. 1. For a Hall readout, the current contacts A, C and sense contacts B, D alternate with each other. If a current I is applied to the current contacts A, C, and if an out-of-plane magnetic field Bz is applied to the device, a Hall voltage $V_H$ proportional to the applied magnetic field Bz will appear between the sense contacts B, D; in other words, VH=VB−VD.

A Hall sensor comprises a Hall element or a cluster of Hall elements and an electronic circuit for operating the Hall element(s) and for evaluating the output signals of the Hall elements. The Hall sensor is manufactured as an integrated circuit which is embedded in a semiconductor chip. The semiconductor chip is packaged in a housing. Hall elements have an offset which arises from process- and geometry-related variations. The offset can be effectively minimized by connecting a plurality of Hall elements in parallel (cluster) and/or by operating using the known spinning current method. This is known from numerous patent documents, for example, WO 0118556, EP 548391, and DE 4302342.

Hall elements can easily be integrated in semi-conducting devices, e.g. in CMOS technology, which implies that they can be combined with advanced on-chip readout circuitry. An implication of the Hall device being co-integrated with other (e.g. readout) devices, is that the Hall element needs to be electrically isolated from the substrate and other components. In integrated technologies, this can be accomplished by using reverse-biased PN-junctions.

Figure 2:
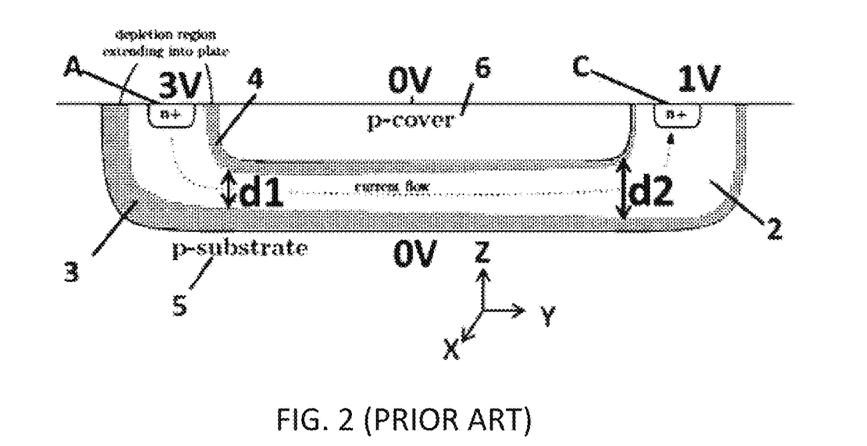
FIG. 2 shows a cross-sectional view of an integrated horizontal Hall plate in accordance with FIG. 1, along the diagonal AC. Depletion-layer variations in a junction-isolated Hall device lead to non-uniform and voltage-dependent plate thickness variations.

In FIG. 2, a cross-section of an integrated horizontal Hall plate is shown, cut along the line where the excitation is applied (line through the contacts A and C in FIG. 1. By way of example, a CMOS process using a p-type substrate has been illustrated. The actual Hall plate then consists of the n-type material of an n-well. In this example, also a p-type covering layer (top shield) is illustrated on top, which is often provided for one or more of various reasons (improved shielding, less noise of the device, etc). In FIG. 2, both substrate and top shield are connected to ground (0 V).

During Hall readout, a current I has to flow through the plate. For this purpose, node A and node C must be at a different voltage. By way of example, it is assumed here that the applied biasing method results in 3.0 V at node A, and 1.0 V at node C. As is well known from the theory of PN-junctions, at any transition between p-type and n-type material a depletion region is formed. The biasing is done in such a way that the PN-junctions are always reverse-biased. The reverse-biased transitions provide electrical isolation of the plate. The isolating depletion regions extend into the Hall plate, near the p-type substrate and the p-type cover (grayed areas in FIG. 2), and have a low number of free charge carriers (i.e. these regions can be considered as nearly perfect isolators). As a result, the effective thickness of the Hall plate is reduced. The actual size of the depletion zone varies in a non-linear way with the local (reverse) voltage over the PN-junctions. This reverse-voltage varies over the plate, being the largest at the node where the current enters (node A at higher potential), and the smallest at the node where the current leaves (node C at lower potential). As a result, the plate thickness (d1 in FIG. 2) at the high-voltage side is smaller than the plate thickness (d2 in FIG. 2) at the low-voltage side, implying a non-uniformity of the plate thickness in the direction from A to C. In other words, the thickness of the Hall plate is not constant, but varies over the plate. Unfortunately, when using current biasing, the effectively applied voltages (between nodes A and C) depend strongly on temperature, but also piezoresistive stress-effects and even the Hall effect itself affects the voltages (i.e. the voltages also vary in the X-direction of FIG. 2). Because these effects modulate the thickness of the plate, they affect the sensitivity and the linearity of the magnetic sensor.

An important characteristic of a Hall sensor is the (magnetic) sensitivity. Ideally, the sensitivity is a constant value, and the measured Hall voltage is a linear function of the magnetic field strength, independent of temperature, stress, etc. In practice, however, this is not entirely true. Yet, in many applications (such as for example in Hall-based linear current sensors), the absolute accuracy of the sensitivity is important. This means that the cross-sensitivities with environmental conditions like temperature, stress, etc. should be reduced, or that at least there is the possibility to compensate for them. Additionally, the dependence of the sensitivity on the Hall voltage, the latter being dependent on the applied magnetic field, implies that the sensor characteristic becomes a non-linear function of the magnetic field.

The semiconductor chip comprising the Hall element packaged in a housing is subjected to mechanical stresses which depend on environmental influences such as temperature and humidity. The varying mechanical stresses cause changes in the offset of the Hall elements, as well as changes in the sensitivity of the Hall elements due to the piezo-Hall effect. Changes in the offset are effectively suppressed using the measures described above. In order to compensate for the changes in sensitivity, it is known, for example, from DE 10154495, DE 10154498, DE 102004003853, DE 102008051949, to use a stress sensor which detects the mechanical stresses, and to use its output signal to compensate for the change in sensitivity of the Hall elements caused by the piezo-Hall effect.

SUMMARY OF THE INVENTION

It is an object of embodiments of the present invention to provide practical methods and devices for determining and optionally compensating for offset in Hall elements.

The above objective is accomplished by a method and device according to embodiments of the present invention.

In one aspect, the present invention provides a method for offset determination in a Hall sensor comprising at least one Hall element having a plate-shaped sensor element made of a doped semiconductor material, the method making use of measurements on the Hall element itself. The method comprises obtaining a first readout signal from the at least one Hall element which is substantially dependent on the magnetic field, obtaining a second readout signal from the at least one Hall element which is substantially independent of the magnetic field, and using the second readout signal for obtaining a prediction of the offset on the first readout signal. The thus obtained prediction of the offset may then subsequently be used for providing offset compensation to the first readout signal, by removing the prediction of the offset from the first readout signal.

With "substantially dependent on the magnetic field" in the context of the present invention is meant that the magnetic field has an influence on the measurement outcome. With "substantially independent of the magnetic field" in the context of the present invention is meant that the magnetic field does not have an influence on the measurement outcome. The latter implies that an unknown magnetic field may be present, but does not need to be present, during the measurement for obtaining the second readout signal.

In another aspect, the present invention provides a Hall sensor with offset compensation. The Hall sensor comprises at least one Hall element, each Hall element having a plate-shaped sensor element made of a doped semiconductor material; sensor means for obtaining a first readout signal from the at least one Hall element which is substantially dependent on the magnetic field (magnetic field does have an influence on the measurement outcome); sensor means for obtaining a second readout signal from the at least one Hall element which is substantially independent of the magnetic field (magnetic field does not have an influence on the measurement outcome); and means for compensating offset on the first readout signal by making use of the second readout signal obtained from a measurement on the at least one Hall element itself. In embodiments of the present invention, the means for compensating offset may be implemented in an analog way, by corresponding analog signal processing. In alternative embodiments of the present invention, the means for compensating offset may be implemented in a digital way, by using a suitably programmed computing means. In yet alternative embodiments, a combined analog-digital implementation is possible.

In yet another aspect, the present invention provides a controller for use with a Hall sensor comprising at least one Hall element. The controller is adapted for obtaining a first readout signal from the at least one Hall element which is substantially dependent on a magnetic field (magnetic field does have an influence on the measurement outcome), for obtaining a second readout signal from the at least one Hall element which is substantially independent of the magnetic field (magnetic field does not have an influence on the measurement outcome), and for using the second readout signal for obtaining a prediction of the offset on the first readout signal.

The present invention also includes a computer program product which provides the functionality of any of the methods according to embodiments of the present invention when executed on a computing device associated with a Hall sensor. Such computer program product can be tangibly embodied in a carrier medium carrying machine-readable code for execution by a programmable processor. The present invention thus relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non-volatile media include, for example, optical or magnetic disks, such as a storage device which is part of mass storage.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

The drawings are only schematic and are non-limiting. In the drawings, the size of some of the elements may be exaggerated and not drawn on scale for illustrative purposes.

The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

When referring to a "Hall sensor" in the context of the present invention, reference is made to a sensor which makes use of the Hall effect when measuring a magnetic field or an electrical current. When an electrical current flows through a Hall sensor which is brought in a magnetic field perpendicular to main current direction, an electrical voltage (Hall voltage) is generated which is substantially proportional to the product of the magnetic field and the current. If the current and the Hall sensor properties are known, the magnetic field component perpendicular to the main current direction can be determined from the measured Hall voltage.

In this document, "Hall plate" and "Hall element" are used as synonyms. They refer to a piece of conductive or semi-conductive material forming part of the Hall sensor through which the current flows for providing the Hall effect.

A "horizontal Hall element" is a Hall element integrated in a chip, in which current lines are parallel to the chip surface, and which is sensitive to a magnetic field perpendicular to the chip surface.

A "vertical Hall element" is a Hall element integrated in a chip, in which the device region that plays the role of the Hall plate is perpendicular to the chip, and which is sensitive to a magnetic field parallel to the chip surface.

When referring to "plate thickness" in the present invention, the thickness of the conductive part of the Hall plate is meant. For example in the horizontal Hall plate of FIG. 1, this means the vertical distance (perpendicular to the chip surface) between the depletion layers. In an embodiment without a top shield, the plate thickness would be the distance between the depletion layer and the chip surface. For the example of a vertical Hall plate of FIG. 16, this means the distance between the depletion layers measured in the y-direction.

When referring to "shield" in the present invention, all material that is of the opposite type as the plate itself and that is directly surrounding the plate is meant. For example in the Hall plate of FIG. 2, the shield is the p-type cover on top of the plate together with the substrate.

When referring to "node" or "electrical node" in the present invention, a part of an electric circuit (e.g. an interconnection) is meant having a single voltage potential.

When referring to "contact" in the present invention, a physical location is meant where an electrical connection to the Hall element is provided. An electrical node may be connected to one or more contacts. In the examples given for horizontal Hall plates, each node is connected to exactly one contact. In the examples given for Vertical Hall plates, some nodes can be connected to two (or more) contacts.

When referring to "Van der Pauw-type measurements", reference is made to a measurement in a plate-shaped device made of doped semiconductor material and having four nodes, each node being associated with at least one contact. The four nodes are divided into two contact pairs, of which one contact pair is used for excitation and the other contact pair is used for measurement. A current is applied to the excitation contacts, and a voltage is measured from the measurement contacts. The set-up is such that, when going over the nodes in an order defined by following the edge of the plate-shaped sensor element, nodes that have a same function, the function being either for excitation or for sensing, appear consecutive. When the contacts, and hence the associated nodes, are located at the edge of the plate-shaped sensor element, their order is clearly defined, and consecutive nodes are nodes adjacent one another when following the edge of the plate-shaped sensor element in a particular direction. When the nodes are not located on the edge of the plate-shaped sensor element, their order needs to be determined. This can be done by shrinking the area of the plate-shaped sensor element until all contacts are located on the edge of the plate, which again allows to determine their order when following the so-defined "new edge" of the plate.

In particular embodiments, the excitation contacts and measurement contacts are selected on the plate-shaped element such that a line segment interconnecting the center points of the excitation contacts does not intersect with a line segment interconnecting the center points of the measurement contacts.

In the following detailed description, and unless stated otherwise, embodiments referred to related to Hall elements as a particular example of plate-shape elements. This is not, however, intended to be limiting for the present invention.

Integrated Hall plates exhibit important offsets due to resistive asymmetries. These asymmetries arise from temperature gradients, piezoresistive changes due to externally imposed or inherent mechanical stress distributions, inhomogeneities in the doping concentrations, and geometrical imperfections (e.g. due to under-diffusion, mask misalignments, . . . ). Also the junction field effect, which causes voltage-dependent resistance changes in the plate, influences the offset.

For horizontal Hall plates, the resulting "raw offset", i.e. the offset appearing when obtaining a signal $V_P$ from the at least one Hall element which is substantially independent of the magnetic field (magnetic field does not have an influence on the measurement outcome), is reported to amount to as much as a few tens of mT, which typically leads to raw offset voltages on the order of a few mV. For integrated vertical Hall elements, the raw offset is typically significantly larger.

Next to resistive asymmetries, also current- and voltage-independent offset voltages due to the Seebeck effect are reported. However, these effects are quantified to be an order of magnitude smaller. They can also be eliminated by averaging two measurements which are chopped versions of each other (i.e. by reversing the biasing direction and reversing the sensing), so as to obtain a readout signal VH from the at least one Hall element which is substantially dependent on the magnetic field. Since the origin of the Seebeck effect lies in temperature differences, this effect can often also be reduced by avoiding unevenly distributed heat generation near and in the Hall plate(s).

An important technique, the present invention, however, not being limited thereto, to combat offset is the "spinning current method". In this method, the readout signals obtained for different (often orthogonal) directions of the bias current are averaged over time. In principle, two measurements are sufficient (to remove offsets due to resistive asymmetries). This minimal situation will be referred to as "two-phase spinning". In many cases, the number of readouts is further varied by also using the chopped variants of the two-phase spinning measurements, resulting in four-phase spinning. Four-phase spinning has a definite advantage over two-phase spinning when Seebeck-related offsets are present, because these are basically rejected. In what follows, the term "residual offset" will be used for the offset that remains after averaging the different spinning current readings, i.e. the offset appearing when obtaining a signal VH from the Hall element substantially dependent on the magnetic field.

It is known that under some conditions two-phase spinning can already provide perfect cancellation of the offset due to resistive asymmetries. Sufficient conditions are: (i) the use of an ideal current source for biasing, (ii) sensing the output voltage of the Hall element without loading (i.e. no current), and (iii) the Hall device should behave perfectly linear. The latter means that the relation between voltages and currents at the four nodes of the sensor element is linear. The argumentation is based on the fairly general principle of reciprocity, and upon closer examination it can be seen that it also applies for non-symmetric Hall devices.

It has been demonstrated that nonlinearity of the Hall plate is a cause of residual offset. In real integrated Hall elements, some nonlinear behaviour is always present. These integrated Hall plates are isolated from their surroundings by pn-junctions. Due to voltage-dependent depletion-effects, the thickness of the plate changes with the voltage. Because typically the magnetic sensitivity of a Hall device is maximized by using (i) lightly doped material, and (ii) sufficiently large biasing voltages, depletion-effects typically become relevant in Hall-based magnetic sensors which target a high sensitivity.

A technique closely related to the above-described spinning current method is to directly combine the readout signals of two (or more) separate Hall plates. The individual Hall plates have bias currents in different directions. This is sometimes called "spatial averaging" or "orthogonal coupling", but the term "geometric spinning" will be used in the context of the present invention. Geometric spinning relies on the fact that typically two neighbouring Hall devices have highly correlated raw offsets. This is basically because the dominant sources for these raw offsets, such as the overall stress in the die, are quite similar. However, it can be easily understood that "geometric spinning" will in general have a higher residual offset compared to time-domain spinning. This is because the offset-causing sources (such are stress and temperature differences) are not perfectly equal for the individual plates. The devices also inherently have static mismatch. Therefore, in order to reduce the residual offset to its minimum, geometric spinning is in most cases combined with time-domain spinning.

There are many applications of Hall sensors where the offset and its long-term drift are important parameters. For instance, for electronic compasses which rely on measuring the small magnetic field of the Earth, a residual offset of 2 µT translates into 4° error in the compass readout. As mentioned above, if the residual offset would be static, it can in principle be removed, but this introduces some additional cost for calibration. However, in order for such calibration to remain effective, the sensor must have a low long-term offset drift, which is in most cases difficult due to drift of package-induced stress. Another application of Hall sensors is in contactless current sensing, where one often needs to accurately detect zero-crossings of the input current. Also here, a low offset with minimal long-term drift is important.

The above mentioned offsets are in many systems dominant w.r.t. the offsets of the electronic readout. State-of-the-art solutions report 100 nV, which is at least four orders of magnitude better than typical raw offsets.

There are two causes of offset that can be considered static (i.e. expected not to change with time): the inhomogeneities in the doping concentrations, and the geometrical imperfections. These are the least difficult category from a calibration point of view, because their effect can in principle be removed by a one-time calibration. It is to be noted that static errors can still interact with other non-static effects (e.g. voltage-dependent depletion-layer modulation).

The remaining non-static offset causes can be roughly separated in two classes: internal (i.e. within the die containing the Hall element and electronic readout circuits) and external (i.e. due to the package and the extended environment). The influence of the external world is mainly determined by the (possibly time-varying) temperature and humidity. If the package is subject to externally imposed temperature gradients, this can be assumed to translate into temperature-gradients within the die, and hence also over the Hall plates. In principle, such temperature-gradients may be detected by using multiple on-chip temperature sensors, e.g. four temperature sensors spaced around the Hall element(s). Therefore, the impact of the external thermal conditions imposed on the sensor through direct heat flow can be fairly well determined. In many cases, only one temperature-measurement near the plates is done, and it is left as a responsibility for the customer to avoid strong thermal gradients over the packaged Hall sensor.

Internal (on-chip) heat sources are now considered, e.g. due to Joule heating in various components. As a result of these internal heat sources, the temperature within the die will rise (slightly) above the ambient level imposed by the environment. Through careful system design and a well-considered layout, temperature-gradients near the Hall elements and the readout electronics should be avoided as much as possible. This includes avoiding unnecessary on-chip heat generation, placing the Hall elements and sensitive electronics on isothermal lines, and removing them as far away as possible from any heat sources.

An important unavoidable heat source is the Joule heating occurring directly in the Hall elements, e.g. due to the biasing current. Here, the sequence of measurements (e.g. when spinning) can be optimized to avoid uneven Joule heating within any of the Hall elements. However, especially when multiple closely-spaced Hall element are used, e.g. in the case of geometric spinning, the time-averaged temperature can still show some small variations over the plates.

The temperature determines to a large extent the resistivity of the plate. Also, the current levels used for biasing the Hall plates are often temperature-dependent (sometimes explicitly, e.g. for the purpose of compensating the temperature-dependency of the magnetic-field sensitivity). Therefore, in general the Joule heat generated within the plate(s) is temperature-dependent. As a result, the magnitude of temperature-gradients becomes itself dependent on the (average) temperature, resulting in a temperature-dependent offset. Also, because an integrated circuit is made of metal and silicon-based materials having different thermal expansion coefficients, temperature-dependent internal stresses exist within the die. Because of piezo-resistive mechanisms, these stresses are also translated into a temperature-dependent offset.

The various offset-generating mechanisms detailed so far depend only on temperature (and possibly thermal gradients imposed by the external environment), and therefore give rise to offsets that depend in a reproducible way on the temperature. This also applies w.r.t. the junction field effect, which next to being voltage-dependent is also to a less extent influenced by temperature (e.g. because the built-in potential of the junction varies with temperature). Also, dynamic effects, e.g. due to spinning, and the readout electronics are often assumed to perform in a reproducible way for each temperature. Therefore, the part of the residual offset resulting only from the above described offset-causes, and even the offset at the end of the signal chain is expected to be reproducible when the temperature is known.

Many state-of-the-art Hall systems have an on-chip temperature sensor, compensation circuitry, and a means for storing calibration data obtained during production, for the purpose of compensating such reproducible temperature-dependent offsets. As a typical example of production-time calibration, the Hall sensor is brought in a zero-gauss chamber for the purpose of eliminating all external magnetic fields. Then, a readout value such as the sensor output can be used as a measure of (residual) offset. This can be repeated for different environmental conditions, such as different temperatures, and the result can be stored under the form of calibration data within the chip. During operation, the stored calibration data may be used to counteract the (residual) offset. This can be done in a large number of ways. For example, in case of a Hall-based sensor with a digital output, the compensation can be accomplished by subtracting the stored (residual) offset from the digital sensor readout. Many other approaches can be used, e.g. using a DAC to inject an offset-correcting signal somewhere in the signal chain (e.g., at the Hall sensor, the front-end readout amplifier, intermediate gain stages, etc.).

Unfortunately, some offset sources are only partly reproducible as a function of temperature. An important example is for example the offset due to package-induced stress. The forces exerted by the package on the die depend to a large extent on the temperature (i.e. there is a fairly large reproducible effect), but also on the amount of humidity absorbed by the package. Since the humidity is not measured, the overall stress within the die varies in a (partly) unpredictable way, which translates through the piezo-resistive effects into an unpredictable offset-component. In literature, stress caused by the package on the semiconductor, e.g. silicon, die is identified as a major source of offset and offset drift.

The present invention relates to the use of the Hall element itself for sensing offset due to stress, and using this offset signal for compensating the stress-dependent offset component.

The present invention discloses a method and device provided with means to measure offset-related signals directly on the Hall element(s) for the purpose of stress-compensation of (residual) offset. It is disclosed how the offset-related signals can be measured even when unknown and fast-varying magnetic fields are present and even when there is mismatch of the magnetic sensitivity of the Hall element between different phases. The method also discloses the compensation approach and the production-time calibration procedures which allow the compensation to be effective.

Figure 3:
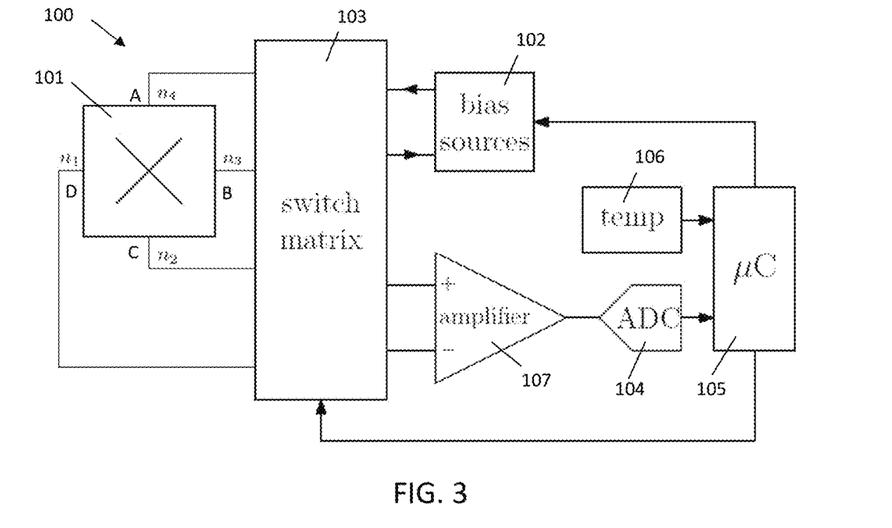
FIG. 3 illustrates a flexible architecture of a Hall magnetic sensor according to embodiments of the present invention.

A Hall sensor 100 according to embodiments of the present invention is illustrated in FIG. 3 and comprises at least one Hall element 101 comprising a plate-shaped sensor element made of a doped semiconductor material, and at least a first excitation node connected to a first excitation contact, at least a second excitation node connected to a second excitation contact, at least a first sense node connected to a first sense contact and at least a second sense node connected to a second sense contact. The plate-shaped sensor element is embedded into a substrate or well such that it can be isolated from the substrate or well by means of a first pn-junction, the substrate or well being connectable to a first fixed voltage. The Hall sensor 100 further comprises one or more biasing sources 102 to supply a current to the at least one Hall element 101 at the excitation nodes, and electronic measurement device which can perform measurements on the at least one Hall element 101 at the sense nodes. The Hall sensor 100 further comprises switches 103 for switching the biasing sources 102 and measurement electronics to various nodes of the at least one Hall element 101.

In a particular embodiment, the Hall sensor 100 comprises electronics circuits for analog-to-digital conversion (ADC) 104, and a controller 105. The ADC 104 is used for converting the measurements performed on the Hall element(s) 101 to a digital form, and make the various measurements done on the Hall element(s) 101 available to the controller 105. The controller 105 may include a computing device, e.g. a microprocessor, for instance it may be a micro-controller. In particular it may include programmable digital logic device such as a Programmable Array Logic (PAL), a Programmable Logic Array (PLA), a Programmable Gate Array (PGA), especially a Field Programmable Gate Array (FPGA). The controller 105 and/or the ADC 104 may be co-integrated on the same die containing the Hall element(s) 101. The controller 105 may be provided with means to control the state of the switches 103.

A Hall sensor 100 according to embodiments of the present invention may further comprise a temperature sensor 106, which preferably measures the temperature close to the Hall element(s) 101.

The Hall sensor 100 according to embodiments of the present invention is provided with means to obtain a first readout signal VH from the at least one Hall element 101, which first readout signal VH is substantially dependent on the magnetic field. Hereinafter, some examples are provided of how this first readout signal VH can be obtained, the present invention, however, not being limited thereto.

The Hall sensor 100 is provided with a biasing source which has at least one node, for being connected to a first excitation node of the Hall element, that sources a biasing current, and another node, for being connected to a second excitation node of the Hall element, that sinks the biasing current (see FIG. 3). The first excitation node of the Hall element 101 may be connected to a supply voltage, or to a current source delivering current to this sourcing node. The second excitation node may be internally connected to another fixed voltage level, e.g. ground, or it may be a connected to a current source sinking current, e.g. to ground. The excitation can be current-mode, but can also be voltage-mode. In some embodiments, means are provided to measure the excitation current. Which ones of the nodes A, B, C, D of the Hall element 101 at any particular moment in time function as excitation nodes, and which ones function as sensing nodes depend on the measurement set-up and the configuration of the switches 103 at that moment in time.

The Hall sensor 100 may be provided with a measurement which has two nodes, a plus node and a minus node, and is able to perform differential measurements. The measurement may preferentially be done in voltage-mode, but may alternatively also be done in current-mode.

In all the measurements described hereafter, measured voltage can be divided by the current applied by means of the bias sources 102, so as to obtain a measured resistance. Results formulated hereafter in term of voltages, have equivalent forms in terms of resistances, conductances or other derived quantities.

Figure 4:
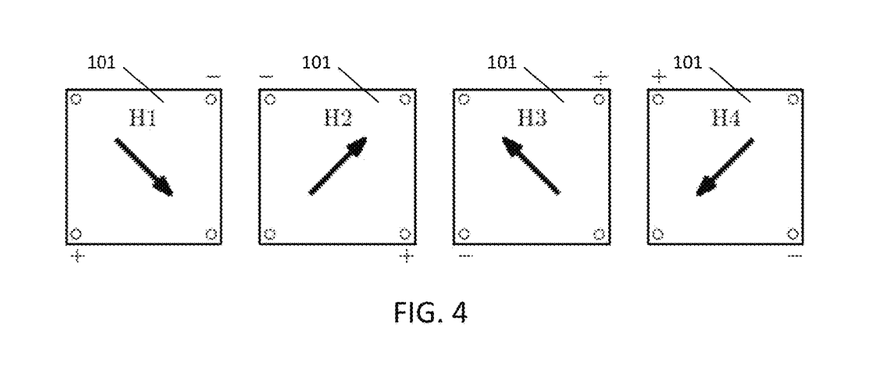
FIG. 4 gives an overview of four Hall-type measurements.

The step of obtaining a first readout signal from the Hall element 101 which is substantially dependent on the magnetic field may for instance comprise performing any of the Hall-type measurements which are illustrated in FIG. 4. FIG. 4 illustrates the measurements being done on a horizontal Hall element comprising four electric nodes (each corresponding to and connected to one contact on the Hall element 101). The measurements can equally well be applied to vertical Hall devices, which also at least have four electric nodes (but where one node may include more than one contact on the Hall element 101).

An arrow drawn between two contacts identifies these contacts as current contacts, the current entering the Hall element 101 at the tail of the arrow, and leaving at the contact pointed to by the head of the arrow. The arrow therefore roughly indicates the direction of current flow within the plate. In the configuration illustrated in FIG. 3, the switches are then operated such that the sourcing node of the bias source is connected to the Hall plate node where the current enters the Hall element 101, and the sinking node of the bias source is connected to the Hall plate node where the current leaves the Hall element 101.

In each configuration shown, the two remaining contacts are the sense contacts. A voltage difference is measured between the sense contacts, being the difference of the voltage at the contact indicated with a plus sign and the voltage of the contact indicated with a minus sign. In the configuration illustrated in FIG. 3, the switches 103 are operated such that the plus node of the measurement device 107 is connected to the Hall plate node indicated with the plus sign, and the minus node of the measurement device 107 is connected to the Hall plate node indicated with the minus sign.

The Hall-type measurements are further characterized by the rule that, when going over the nodes in an order defined by following the edge of the Hall element 101, two consecutive nodes have a different function, i.e. the Hall element nodes used for sensing alternate with the Hall element nodes for supplying the current. When the contacts, and hence the associated nodes, are located at the edge of the plate-shaped sensor element, their order is clearly defined, and consecutive nodes are nodes adjacent one another when following the edge of the plate-shaped sensor element in a particular direction. When the nodes are not located on the edge of the plate-shaped sensor element, their order needs to be determined. This can be done by shrinking the plate area until all contacts are located on the edge of the plate, which again allows to determine their order when following the so-defined "new edge" of the plate.

The four Hall-type readout signals according to the configurations shown in FIG. 4 are denoted by $V_{h,1}$, $V_{h,2}$, . . . $V_{h,4}$. Any of these measurements can be used for $V_H$. Each of these Hall-type measurements has with it associated an offset $V_{o,i}$, which is the measurement result obtained in the absence of a magnetic field (i.e. B=0):

$V_{o1}=V_{h1}|_{B=0}$ $V_{o2}=V_{h2}|_{B=0}$ $V_{o3}=V_{h3}|_{B=0}$ $V_{o4}=V_{h4}|_{B=0}$

The step of obtaining a readout signal from the Hall element 101 which is substantially dependent on the magnetic field B may comprise averaging different Hall-type measurements. This averaging may involve Hall-type measurements obtained sequentially, such as is the case for two-phase spinning and four-phase spinning. Alternatively or in combination therewith, this averaging may also involve Hall-type measurements done on an interconnection of at least two Hall plates, such as is the case for geometric spinning.

In embodiments of the present invention, the $V_H$ signal may be obtained by four-phase spinning of a single Hall element. The $V_H$ corresponds then to the average of the four Hall-type readouts ($V_{h,1}$, $V_{h,2}$, ... $V_{h,4}$):

$$V_H = \frac{V_{h,1} + V_{h,2} + V_{h,3} + V_{h,4}}{4} \quad (1)$$

The first readout signal $V_H$ can be decomposed in two components:

$$V_H = V_O + S \cdot B \quad (2)$$

The first term ($V_O$) corresponds with the offset, while the second term S. B is the magnetic component (S denoting the magnetic sensitivity).

The Hall sensor 100 according to embodiments of the present invention is further provided with means to obtain a second readout signal $V_P$ from the at least one Hall element 101 which is substantially independent on the magnetic field B, and which is used for predicting the offset $V_O$ on the first readout signal $V_H$. Hereinafter, some examples are provided of how this second readout signal $V_P$ can be obtained, the present invention, however, not being limited thereto.

Hall-type measurements cannot be directly used as the second readout signal $V_P$, because they depend on the magnetic field B. However, by making a linear combination with at least two Hall-type measurements, the component due to the magnetic field may be cancelled. As an example, the difference between two Hall-type measurements may be taken:

$$V_P = \frac{V_{h,i} - V_{h,j}}{2}$$

with i,j∈{1,2,3,4} and i≠j. By splitting in offset and magnetic components, and assuming the magnetic sensitivity and the magnetic field to be the same in both situations, the following is obtained:

$$\begin{cases} V_{h,i} = V_{o,i} + S \cdot B \\ V_{h,j} = V_{o,j} + S \cdot B \end{cases} \Rightarrow V_P = \frac{V_{h,i} - V_{h,j}}{2} = \frac{V_{o,i} - V_{o,j}}{2}$$

Therefore, under these conditions, $V_P$ is substantially independent of the magnetic field, and clearly related to the offsets occurring during Hall-type measurements. If the magnetic sensitivities are not exactly the same, but remain constant, a slightly different linear combination of $V_{h,i}$ and $V_{h,j}$ can be used to let the magnetic component cancel. It is anticipated that this would require calibration measurements to determine the ratio of the sensitivities.

A second example of a linear combination of Hall-type measurements is obtained by combining all four Hall-type readouts according to:

$$V_P = \frac{V_{h,1} - V_{h,2} + V_{h,3} - V_{h,4}}{4} \quad (3)$$

Again assuming the same magnetic field is present during the individual measurements, and that the magnetic sensitivities are equal, it can easily be derived that Eq. (3) is substantially independent of the magnetic field B, and is given by:

$$V_P = \frac{V_{o,1} - V_{o,2} + V_{o,3} - V_{o,4}}{4} = V_{raw}$$

which corresponds with the average raw offset $V_{raw}$.

Figure 5:
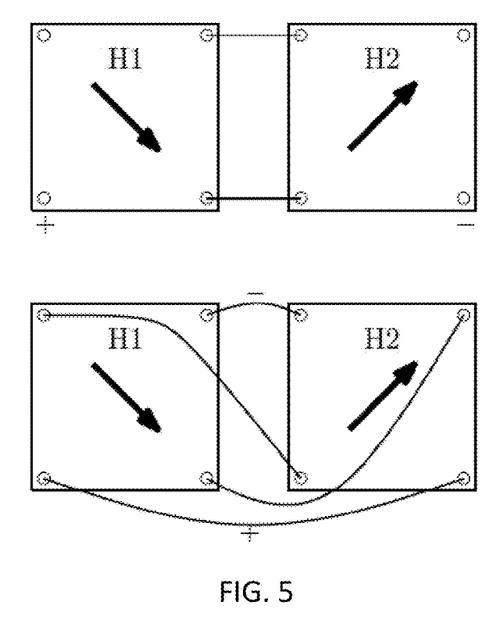
FIG. 5 illustrates examples of two Hall elements with interconnected Hall-type measurements to cancel the magnetic component. The upper part of the figure illustrates a series-series connection of two Hall plates, and the bottom part of the figure illustrates a parallel-parallel connection of two Hall plates.

If at least two (closely spaced) Hall plates are used, a technique referred to as "altered geometric spinning of Hall-measurements" can be applied. In this case, the Hall plates are interconnected in a way that makes the magnetic components cancel. This is accomplished by providing switches which can electrically connect two nodes of each Hall plate. The top part of FIG. 5 provides a first example of two Hall plates, each in a Hall-type configuration, with both the excitation and the sensing put in series. The bottom part of FIG. 5 provides a second example of two Hall plates, each in a Hall-type configuration, with both the excitation and the sensing put in parallel. Combinations can also be made, e.g. parallel-connection of the excitation and series-connection of the sensing signals. The advantage of "altered geometric spinning of Hall-measurements" is that now the magnetic components correspond to an external field at the same instant in time. The cancellation of the magnetic-field component then depends mainly on a good matching of the sensitivity between the individual Hall elements.

Figure 6:
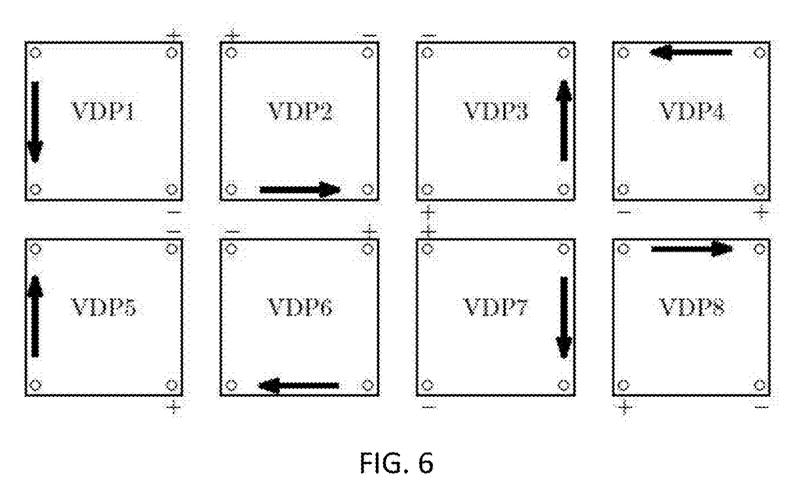
FIG. 6 shows an overview of eight "Van der Pauw"-type measurements.

In accordance with embodiments of the present invention, the step of obtaining a second readout signal from the Hall element 101 which is substantially independent of the magnetic field may comprise performing any of the "van der Pauw"-type (VDP) measurements which are illustrated in FIG. 6. The figure illustrates the measurements being done on a horizontal Hall element 101 comprising four electric nodes (each corresponding to one contact on the Hall element). The measurements can equally well be applied to vertical Hall devices, which also at least have four electric nodes (but where one node may include more than one contact on the Hall element).

An arrow drawn between two contacts identifies these contacts as current contacts, the current entering the Hall element at the tail of the arrow, and leaving at the contact pointed to by the head of the arrow. The arrow therefore roughly indicates the direction of current flow within the plate. In the exemplary device according to embodiments of the present invention illustrated in FIG. 3, the switches 103 are then operated such that the sourcing node of the bias source 102 is connected to the Hall plate node where the current enters the Hall element 101, and the sinking node of the bias source 102 is connected to the Hall plate node where the current leaves the Hall element 101.

In each configuration shown, the two remaining contacts are the sense contacts. A voltage difference is measured between the sense contacts, being the difference of the voltage at the contact indicated with a plus sign and the voltage of the contact indicated with a minus sign. In FIG. 3, the switches 103 are operated such that the plus node of the measurement device 107 is connected to the Hall plate node indicated with the plus sign, and the minus node of the measurement device 107 is connected to the Hall plate node indicated with the minus sign.

The VDP-type measurements are further characterized by the rule that, when going over the nodes in an order defined by following the edge of the plate-shaped sensor element, nodes that have a same function, the function being either for excitation or for sensing, appear consecutive. When the contacts, and hence the associated nodes, are located at the edge of the plate-shaped sensor element, their order is clearly defined, and consecutive nodes are nodes adjacent one another when following the edge of the plate-shaped sensor element in a particular direction. When the nodes are not located on the edge of the plate-shaped sensor element, their order needs to be determined. This can be done by shrinking the area of the plate-shaped sensor element until all contacts are located on the edge of the plate, which again allows to determine their order when following the so-defined "new edge" of the plate.

An advantage of using "van der Pauw"-type measurements for deriving the second readout signal $V_P$ is that these are substantially insensitive to the presence of magnetic fields. The reason for this is that the Hall effect changes the potential of both the sensing contacts in an equal way, which implies that it has nearly no influence on the voltage differences measured during these VDP measurements. Therefore, also the time taken to do VDP-type measurements is not constrained by the requirement that the magnetic field must remain constant.

Figure 7:
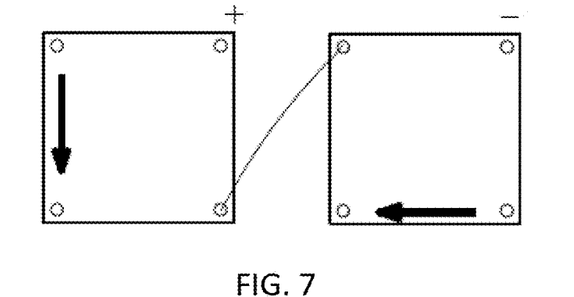
FIG. 7 illustrates the interconnection of the sensing nodes of two plates, each plate being operated in a "Van der Pauw"-type configuration, allowing to directly measure the difference of the two "Van der Pauw"-type measurements. The excitation nodes may be put in parallel.

In particular embodiments of the present invention, the step of obtaining a second readout signal $V_P$ from the Hall element 101, which second readout signal $V_P$ is substantially independent of the magnetic field B, may comprise taking the difference of two "van der Pauw"-type measurements. This difference may involve "van der Pauw"-type measurements obtained sequentially. Alternatively, this difference may be obtained by doing a single measurement on an interconnection of at least two Hall plates 101, each individual Hall element 101 being in a "van der Pauw"-type configuration. An example is provided in FIG. 7.

In embodiments of the present invention, the step of obtaining a second readout signal $V_P$ from the Hall element 101, which second readout signal $V_P$ is substantially independent of the magnetic field B may comprise averaging readout signals $V_P$ obtained through any of the possibilities described above. This includes averaging over configurations of the same type similar to multi-phase spinning.

In embodiments of the present invention, the step of obtaining a second readout signal $V_P$ from the Hall element 101 which is substantially independent of the magnetic field may comprise determining a linear combination of the eight VDP measurements according to $$V_P = V_{vdp,raw} = \frac{V_{v2} - V_{v1} + V_{v4} - V_{v3} + V_{v6} - V_{v5} + V_{v8} - V_{v7}}{4} \quad (5)$$

or $$V_P = V_{vdp,res} = \frac{V_{v1} - V_{v5} + V_{v2} - V_{v6} + V_{v3} - V_{v7} + V_{v4} - V_{v8}}{4} \quad (6)$$

We have now available the first readout signal $V_H$, which according to Eq. (2) can be decomposed in the offset $V_O$ and a term relative to the magnetic component B. It is clear that if the system is able to estimate $V_O$, an offset-compensated readout can be obtained.

The Hall sensor 100 according to embodiments of the present invention is provided with a means for determining an estimate $\hat{V}_O$ of $V_O$ from the second readout signal $V_P$. With this, an offset-compensated signal may be derived:

$$V_{H,comp} = V_H - \hat{V}_O \quad (7)$$

which can be further used for determining the magnetic field. There are many possibilities to obtain an offset-compensated signal according to Eq. (7). For a flexible architecture such as the one illustrated in FIG. 3, this can be implemented by the controller 105 as a digital subtracting. The same effect could be accomplished in other ways, e.g. by injecting compensating signals in the front-end, as will be readily appreciated by a person skilled in the art. There where the prediction of the signal for performing offset compensation signal is part of the invention, applying such signaling order to obtain an offset-compensated signal lies within the normal skills of a person skilled in the art.

Predicting Hall-Type Offsets from VDP Measurements

In the idealized case of a linear Hall element, there are some mathematical relations that can be derived between the offsets of Hall-type readouts, and the difference of VDP measurements proposed for use as a possible second readout signal $V_P$. Especially for weakly nonlinear plates, good predictors can be derived for offset-compensating $V_H$.

It can be derived from L. J. van der Pauw, "A method of measuring specific resistivity and Hall effect of discs of arbitrary shape," Philips Research Reports, vol. 13, no. 1, 1958, for isotropic material, or from R. T. H. Shibata, "A potential problem for point contacts on a two-dimensional anisotropic medium with an arbitrary resistivity tensor," J. Appl. Phys., vol. 66, no. 10, November 1989, for anisotropic material, that the two "Van der Pauw measurements" and the offset measurement are linearly related. The proof thus obtained still depends on side-conditions implicitly imposed in these publications, e.g. it is assumed that the material has uniform properties through the structure.

The inventors have derived that the same relations remain valid for non-uniform materials. The derivation is also valid for Hall plates with extended contacts, and contacts which are not located at the edge of the plate. The outlines are presented hereafter.

Figure 8:
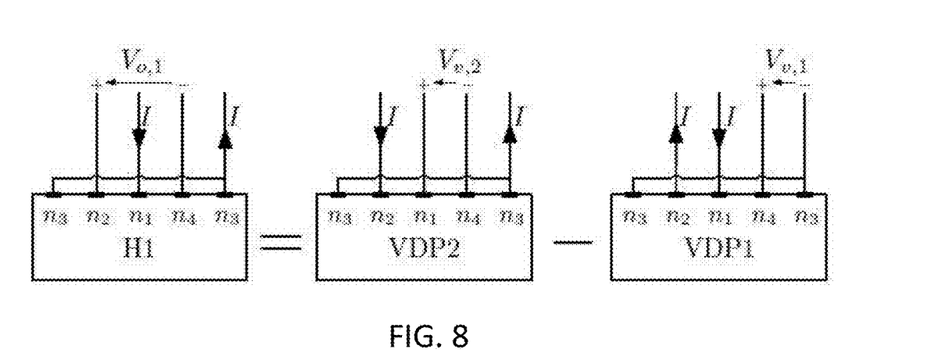
FIG. 8 illustrates the relation between offset in a Hall-type measurement and the difference of two "Van der Pauw"-type measurements.

At zero magnetic field, a linear Hall plate is described by a resistance-matrix relating the voltages and currents at the four nodes. A general asymmetric Hall plate has six independent parameters at zero field, as can be found in "Limits of Offset Cancellation by the Principle of Spinning Current Hall Probe", Proceedings of IEEE Sensors, October 2004, pp. 1117-1120, incorporated herein by reference. Using straightforward calculation, expressions for the offset during Hall-based measurement have been obtained (as a function of the six independent parameters). With current-biasing, it is found that $V_{o1} = -V_{o2} = V_{o3} = -V_{o4}$, which is consistent with what is expected from using reciprocity principles. By similar calculations, expressions for the VDP measurements (with current-biasing and using the same current) can be derived. Then it can be directly established that $V_{v1} = V_{v3} = V_{v5} = V_{v7} \stackrel{\text{def}}{=} V_{v,odd}$ and $V_{v2} = V_{v4} = V_{v6} = V_{v8} \stackrel{\text{def}}{=} V_{v,even}$. It has been derived that $V_{o1} = -V_{o2} = V_{o3} = -V_{o4} = V_{v,even} - V_{v,odd}$ Therefore, it has been found that for a linear Hall element 101, the difference between any of the even-phase VDP-type measurements and any of the odd-phase VDP-type measurements is equal to the raw offset of the Hall measurements (possibly with an extra minus sign). As an example, reference is made to the measurements on a vertical Hall plate as shown in FIG. 8.

The derived equations apply in theory only for linear materials. They remain approximately valid in case of non-linear Hall elements, which typically exhibit some voltage-dependent nonlinearity. The inventors have found that by averaging several of the VDP-based offset predictions, an estimate can be obtained for the average offsets occurring during Hall-type readouts. For instance, it has been demonstrated that Eq. (5) deviates little from Eq. (3), even when voltage-dependent nonlinearities are present. The advantage of using Eq. (5) is that each individual VDP measurement is substantially independent of the magnetic field, while Eq. (3) requires the cancellation of magnetic components. There are also theoretical arguments to expect a good correlation between Eq. (6) and the residual offset associated with the $V_H$ of Eq. (1):

$$V_O = V_H |_{B=0} = \frac{V_{o,1} + V_{o,2} + V_{o,3} + V_{o,4}}{4} \tag{8}$$

Therefore, Eq. (6) might provide an offset-related signal which gives a more direct estimation of the residual offset $V_O$ after four-phase spinning as defined by Eq. (8).

Linear Prediction

In some cases, the second readout signal $V_P$ can be directly used for predicting the offset $V_O$ on the first readout signal $V_H$, without calibration being performed. For instance, when considering a single Hall-type measurement being done, e.g. $V_H = V_{h1}$, and when using $V_P = V_{v2} - V_{v1}$, and $\hat{V}_O = V_P$. Based on the above relations, one can see that this would provide a perfect compensation if the Hall element would be linear.

The above estimation rule $\hat{V}_O = V_P$ is an example of a linear estimator, which has the more general form:

$$\hat{V}_O = a + b \cdot V_P \tag{9}$$

This estimation law can be used advantageously when a fairly well-known correlation exists between the offset $V_O$ and the predictive $V_P$ signal. Because offset-related signals are all influenced by an identical set of causes, such correlations can be expected. Such correlations can be determined from characterization measurements performed on the Hall devices. However, the magnitude of $V_O$ and $V_P$ might differ strongly. This is for instance the case when $V_P$ is the average raw offset as defined by Eq. (3) or its VDP-based prediction as given by Eq. (5), and $V_O$ is the residual offset as given by Eq. (14) after four-phase spinning. In such cases, a small factor b is needed in the estimation rule.

The estimation of the offset can be further improved by allowing the parameters a and b in the offset-prediction to be temperature dependent.

Optimized Prediction Through Calibration

In order to improve the performance of the linear predictor as defined by Eq. (9), the parameters a and/or b can be optimized for each individual Hall sensor 100, by means of calibration.

If the offset $V_O$ would depend only on temperature and would be reproducible, it could be determined during a calibration-measurement at a known magnetic field, preferably zero magnetic field. This could then be taken as the a-term in Eq. (9), which would perfectly compensate the offset. There would not be any need for the b-term, nor for doing measurements to obtain $V_P$. However, as has been noted before when discussing offset drift, some offset sources are only partly reproducible as a function of temperature, but for instance also depend on the package-induced stress. The calibration approach according to embodiments of the present invention provides a means to compensate for these partly irreproducible effects that occur.

The offsets within the planar Hall plates typically depend mainly on one particular stress-component, denoted by a. For instance, a square horizontal Hall element on a (100) wafer aligned along the <101> flat is sensitive to in-plane differential stress $\sigma = \sigma_D = \sigma_{xx} - \sigma_{yy}$, while these offsets are not directly influenced by in-plane isotropic stress $\sigma_1 = \sigma_{xx} + \sigma_{yy}$, nor by in-plane shear stress $\sigma_{xy}$.

The influence of the unknown stress in the true offset $V_O$ and the offset-prediction signal $V_P$ can now be isolated. Since small effects can be expected, a linear approximation can be used:

$$V_O \cong V_{O,rep}(T) + \alpha(T)\sigma \tag{10}$$

$$V_P \cong V_{P,rep}(T) + \beta(T)\sigma \tag{11}$$

In this, $V_{O,rep}(T)$ and $V_{P,rep}(T)$ represent the reproducible components (that always vary in the same way with temperature), while and are the possibly temperature-dependent stress-dependencies, which are depending on the materials used.

Calibration Procedure for Obtaining Reference Signals

Now is described a first production-time calibration procedure to determine two reference curves ($V_{Oref}(T)$ and $V_{Pref}(T)$) which will be used during operation of the Hall sensor for compensating the offset.

The sensor system is brought in a reference state, e.g. any of the states described in the table at the end of this description. As an example, the sensor system could be in its final packaged form. The sensor system is brought at a number of temperatures $T_n$ for n=1 ... N. The magnetic field is assumed to be known, preferably the magnetic field is zero. At each temperature $T_n$, the system provides a measure of the first readout signal $V_{Href,n}$, from which the magnetic component corresponding to the known magnetic field can be subtracted to obtain the (residual) offset $V_{Oref,n}$, and the system provides a measure of the second readout signal $V_{Pref,n}$. In case the magnetic field is known to be zero, e.g. by bringing the sensor in a zero-Gauss chamber, the first readout signal directly corresponds to the (residual) offset $V_{Oref,n}$. A measure for the temperature Tn may come from an on-chip temperature sensor, or it may be measured by external equipment. The obtained measurements $V_{Href,n}$ (or possibly $V_{Oref,n}$) and $V_{Pref,n}$ can be translated in an interpolation form, e.g. through fitting or using table-based interpolation, giving rise to two reference curves: $V_{Oref}(T)$ and $V_{Pref}(T)$.

During the above calibration steps, an unknown and temperature-dependent stress level $\sigma = \sigma_{ref}(T)$ is present. Therefore, the two reference signals are approximately given by:

$$V_{Oref}(T) \approx V_{O,rep}(T) + \alpha(T)\sigma_{ref}(T) \tag{12}$$

$$V_{Pref}(T) \approx V_{P,rep}(T) + \beta(T)\sigma_{ref}(T) \tag{13}$$

The same calibration procedure can be used in case another physical effect causes partly unpredictable outcomes in the offset. The symbol a then represents this other physical effect.

On-Chip Compensation Using the Reference Signals

In embodiments of the present invention, the Hall sensor system implements a linear offset-predictor of the type of Eq. (9) with $$a(T)=V_{Oref}(T)-b(T)V_{Pref}(T)$$

This predictor can also be written as:

$$\hat{V}_O=V_{Oref}(T)+b\cdot(T)(V_P-V_{Pref}(T)) \quad (14)$$

In this, the reference signals $V_{Oref}(T)$ and $V_{Pref}(T)$ are substantially equal to the ones determined during the calibration procedure. The signal $V_P$ is the second readout signal, which can be measured without explicit knowledge of the temperature T, but will typically depend on the temperature T of the Hall element(s). During operation, the magnetic field is typically nonzero, but this has nearly no influence on the second readout signal $V_P$, which is assumed to be substantially independent of the magnetic field. The reference signals $V_{Oref}(T)$ and $V_{Pref}(T)$ may be generated explicitly as an analog signal, e.g. a voltage or a current or a pulse-width, based on calibration data that is stored on-chip in some non-volatile form, e.g. using EPROM memory.

For the purpose of explicitly generating the reference signals, or a combination of these signals, circuits may be used which combine sources which may have different temperature-dependencies. The non-volatile information may then be used to define how these sources are combined to generate a reference signal, or a combination of reference signals. The on-chip sources are put sufficiently close to the Hall elements to have their temperature substantially equal to the temperature T of the Hall elements. This approach allows to generate the reference signals $V_{Oref}(T)$ and $V_{Pref}(T)$ without measuring the temperature explicitly.

In other embodiments, the non-volatile calibration data stored on-chip may consist of table-based values, or stored coefficients of interpolation functions. During operation, the actual temperature $T_a$ may be measured. Based on this measured actual temperature $T_a$, the tables and/or interpolation functions can be used to determine the reference signals. This may be accomplished by means of calculation, e.g. using a controller 105 such as in the embodiment shown in FIG. 3.

Alternatively, the reference signal $V_{Oref}(T)$ can be considered to correspond to a usual temperature-dependent offset-compensation, which can be implemented in any of the forms which may be known to the person skilled in the art. The term $b\cdot(V_P-V_{Pref}(T))$ can often be considered a smaller compensation of the less reproducible effects, such as stress due to the package. Compensation for this extra term can often be implemented by adapting an already known temperature-dependent offset-compensation method.

The b-factor in Eq. (14) may be constant, or it may depend on temperature. The signal corresponding with the second term may be generated in an analog way, with the b-factor implemented as the gain of a circuit. Another possibility is to explicitly generate an analog signal 1/b(T), e.g. as a voltage, and use this as a reference voltage in an analog-to-digital converter which converts the signal $V_P-V_{Pref}$ to the digital domain. Yet another possibility is to use a fixed reference voltage for the ADC, and implement the gain-factor b in the digital domain.

Optimized Prediction Through Second Calibration

The b-factor in the offset-predictor of Eq. (14) may be further optimized by means of additional calibration measurements. This can be done by going through a second production-time calibration procedure.

During the second production-time calibration, the sensor system is brought in a second state, which is characterized by, for instance, the fact that a different stress level $\sigma=\sigma_{sec}(T)$ occurs. Examples are provided in the table at the end of this description. The sensor system is brought again at a number of temperatures $T_m$ for m=1 ... M, which temperatures may be the same as or may different from the temperatures used during the reference calibration. Similar measurements as during the reference calibration are done, leading to a second set of interpolation curves $V_{Osec}(T)$ and $V_{Psec}(T)$. The following signals are obtained:

$$V_{Osec}(T) \approx V_{Orep}(T)+\alpha(T)\sigma_{sec}(T) \quad (15)$$

$$V_{Psec}(T) \approx V_{Prep}(T)+\beta(T)\sigma_{sec}(T) \quad (16)$$

A possibly temperature-dependent optimal scale factor b can now be derived as:

$$b(T) \stackrel{def}{=} \frac{V_{Osec}(T) - V_{Oref}(T)}{V_{Psec}(T) - V_{Pref}(T)} \quad (17)$$

In case a common set of temperatures Tn have been used, b(T) can also be found from interpolation the set of values (Tn,bn) with $$b_n \stackrel{def}{=} \frac{V_{Osec,n} - V_{Oref,n}}{V_{Psec,n} - V_{Pref,n}}$$

Combining now the definition of b(T) with Eq. (12), Eq. (13), Eq. (15) and Eq. (16), it is obtained that $$b(T) \approx \frac{\alpha(T)}{\beta(T)} \quad (18)$$

provided that $\sigma_{sec}(T)-\sigma_{ref}(T)$ is not too small. When σ represents stress, this means that the stress during the secondary calibration should be sufficiently different from the stress during the reference calibration. It is fairly easy to show that with Eq. (18), the linear predictor of Eq. (14) exactly reproduces the offset as measured in the reference calibration when the same stress-level $\sigma=\sigma_{ref}$ would appear, i.e. we then have $\hat{V}_O=V_{Oref}(T)$. At the same time, the linear predictor of Eq. (14) exactly reproduces the offset as measured in the secondary calibration when the same stress-level $\sigma=\sigma_{sec}$ would appear.

The dual calibration approach is quite general, and includes many interesting special cases. Some of these are summarized in the next table:

| approach | reference | secondary |
| --- | --- | --- |
| 1 | wafer-level | packaged |
| 2 | packaged | wafer-level |
| 3 | dry package | humid package |
| 4 | packaged | extra force on package |

Of course the secondary calibration, e.g. when it involves measurements on the wafer-level, may in reality precede the reference calibration, e.g. when it involves measurements on the packaged device.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

The invention claimed is:

1. A method for offset determination in a Hall sensor for measuring a magnetic field,
the Hall sensor comprising: at least one Hall element having a plate-shaped sensor element made of a doped semiconductor material,
the method comprising:
i) obtaining a first readout signal ($V_H$) from the at least one Hall element by using a first technique which makes use of measurements on the Hall element and yields a result that is substantially dependent on the magnetic field to be measured including an offset ($V_O$) to be determined,
ii) obtaining a second readout signal ($V_P$) from the at least one Hall element by using a second technique which makes use of measurements on the Hall element and yields a result that is substantially independent of the magnetic field but is correlated to said offset ($V_O$),
wherein obtaining the second readout signal comprises making linear combinations of readout signals with at least two Hall-type measurements, so that the magnetic field component is cancelled out or comprises at least one Van der Pauw type measurement, and
wherein the second readout signal is measured, during operation, in the presence of the magnetic field, and
iii) using the second readout signal ($V_P$) for obtaining a prediction ($\hat{V}_O$) of the offset ($V_O$) on the first readout signal ($V_H$) as a linear function of the second readout signal ($V_P$), expressed as $\hat{V}_O = a + b\ V_P$, a and b being parameters in the linear function, wherein the parameters a and b are optimized by means of a calibration procedure that includes
bringing the Hall sensor in a reference state,
bringing the Hall sensor in an environment with a known magnetic field and at a known temperature (T) selected from a first set of temperatures, and
recording, for each temperature (T) of the first set of temperatures, the first readout signal obtained by using the first technique, to obtain a first reference curve ($V_{Oref}(T)$), and the second readout signal obtained by using the second technique to obtain a second reference curve ($V_{Pref}(T)$).

2. The method according to claim 1, wherein the parameters a and b in the offset prediction ($\hat{V}_O$) are temperature dependent.

3. The method according to claim 1, further comprising determining the parameter b by means of a calibration procedure comprising the steps of:
bringing the Hall sensor in an environment with known magnetic field and at a known temperature selected from a second set of temperatures, and
recording, for each temperature of the second set of temperatures, the first readout signal ($V_H$) obtained by using the first technique as a third reference signal ($V_{Osec}(T)$), and the second readout signal ($V_P$) obtained by using the second technique as a fourth reference signal ($V_{Psec}(T)$), and
determining the parameter b from the recorded reference signals as a scale factor between ($V_{Osec} - V_{Oref}$) and ($V_{Psec} - V_{Pref}$), with the assumption that the reference signals are interpolated when they need to be determined at a temperature for which no direct measurement is available.

4. The method according to claim 1, wherein obtaining the second readout signal ($V_P$) from the at least one Hall element of step ii) comprises making linear combinations of readout signals with at least two Hall-type measurements, so that the magnetic field component is cancelled out.

5. The method according to claim 1,
wherein obtaining the second readout signal ($V_P$) from the at least one Hall element of step ii) comprises readout of a configuration comprising at least two neighbouring Hall elements which are interconnected such that the magnetic field components of the individual Hall elements cancel one another out; and/or
wherein obtaining the second readout signal ($V_P$) from the at least one Hall element of step ii) comprises averaging of measurement signals obtained from geometric spinning measurements on a plurality of neighbouring Hall elements.

6. The method according to claim 1, at least one Hall element comprising at least four nodes, wherein obtaining a second readout signal ($V_P$) from the at least one Hall element of step ii) comprises obtaining measurement signals in a Van der Pauw-type measurement set-up of the Hall element wherein nodes that have a same function appear consecutive when going over the nodes in an order defined by following the edge of the plate-shaped sensor element, the second readout signal ($V_P$) being obtained by differencing two Van der Pauw-type measurements on the at least one Hall element.

7. The method according to claim 6,
wherein either differencing two Van der Pauw-type measurements includes differencing two Van der Pauw measurements obtained sequentially; or
wherein differencing two Van der Pauw-type measurements is obtained by performing a single measurement on an interconnection of at least two Hall plates.

8. The method according to claim 6, wherein obtaining a second readout signal ($V_P$) from the at least one Hall element of step ii) comprises taking a linear combination of a plurality of Van der Pauw-type measurements on the at least one Hall element.

9. The method according to claim 1, wherein obtaining the second readout signal ($V_P$) from the at least one Hall element of step ii) comprises making linear combinations of readout signals with at least two Hall-type measurements, in such a way that the magnetic field component comprises at least one Van der Pauw type measurement.

10. The method according to claim 1,
furthermore comprising measuring the actual temperature (Ta) and using this actual temperature (Ta) in the offset prediction; and/or
further comprising the step of iv) removing the offset prediction ($\hat{V}_O$) from the first readout signal ($V_H$) to compensate the offset ($V_O$).

11. A semiconductor chip comprising a Hall sensor, the Hall sensor comprising:
at least one Hall element, each Hall element having a plate-shaped sensor element made of a doped semiconductor material,
sensor means for obtaining a first readout signal ($V_H$) from the at least one Hall element using a first technique that makes use of measurements on the Hall element and yields a result which is substantially dependent on the magnetic field and has an offset ($V_O$) to be determined,
sensor means for obtaining a second readout signal ($V_P$) from the at least one Hall element using a second technique that makes use of measurements on the Hall element and yields a result which is substantially independent of the magnetic field but is correlated to said offset ($V_O$), wherein obtaining the second readout signal comprises making linear combinations of readout signals with at least two Hall-type measurements, so that the magnetic field component is cancelled out or comprises at least one Van der Pauw type measurement, and wherein the second readout signal is measured, during operation, in the presence of the magnetic field, and means for obtaining a prediction ($\hat{V}_O$) of the offset ($V_O$) on the first readout signal ($V_H$) as a linear function of the second readout signal ($V_P$), expressed as $\hat{V}_O = a+b\ V_P$, a and b being parameters in the linear function, wherein the parameters a and b are optimized by means of a calibration procedure that includes bringing the Hall sensor in a reference state, bringing the Hall sensor in an environment with a known magnetic field and at a known temperature (T) selected from a first set of temperatures, and recording, for each temperature (T) of the first set of temperatures, the first readout signal obtained by using the first technique, to obtain a first reference curve ($V_{Oref}(T)$), and the second readout signal obtained by using the second technique to obtain a second reference curve ($V_{Pref}(T)$), and means for compensating the offset ($V_O$) on the first readout signal ($V_H$) based on the prediction signal ($\hat{V}_O$).

12. The semiconductor device according to claim 11, wherein the means for compensating the offset ($V_O$) comprises a controlled source for compensating offset on the first readout signal ($V_H$), the controlling of the source being based on the measured second readout signal ($V_P$).

13. The semiconductor device according to claim 11, wherein the means for compensating offset comprises a controller arranged to obtain a prediction ($\hat{V}_O$) of the offset ($V_O$) on the first readout signal ($V_H$) by making use of the second readout signal ($V_P$).

14. The semiconductor device according to claim 13,
wherein the controller is adapted for determining the prediction ($\hat{V}_O$) of the offset ($V_O$) on the first readout signal ($V_H$) as a linear function of the second readout signal ($V_P$), expressed as $\hat{V}_O = a+b\ V_P$, a and b being parameters in the linear function; and/or comprising storage means storing on chip, in a non-volatile form, calibration data obtained from a calibration procedure, wherein the storage means is a non-volatile memory for storing parameter values (a, b), and wherein the controller is adapted for using the parameters a and/or b which are optimised during a calibration procedure and retrieved from the non-volatile memory.

15. The semiconductor device according to claim 11, the at least one Hall element comprising at least a first node connected to a first contact, at least a second node connected to a second contact, at least a third node connected to a third contact and at least a fourth node connected to a fourth contact, sets of two contacts forming a contact pair, the Hall sensor furthermore comprising a switching matrix arranged to operate the at least one Hall element in at least two different measurement set-ups, wherein a different combination of contact pairs provides a different measurement result.

16. The semiconductor device according to claim 15,
wherein either the sensor is adapted for sequentially determining readout signals of different measurement set-ups from a single Hall element; or wherein the sensor is adapted for simultaneously determining readout signals of different measurement set-ups from a plurality of Hall elements.

17. The semiconductor device according to claim 11, furthermore comprising temperature measurement means for measuring the actual temperature (Ta), the means for compensating offset on the first readout signal ($V_H$) being adapted for using this actual temperature (Ta) during compensation.

* * * * *